(12) United States Patent
Ahmad

(10) Patent No.: US 9,734,032 B1
(45) Date of Patent: Aug. 15, 2017

(54) DIAGNOSTIC COVERAGE OF REGISTERS BY SOFTWARE

(71) Applicant: Xilinx, Inc., San Jose, CA (US)

(72) Inventor: Sagheer Ahmad, Cupertino, CA (US)

(73) Assignee: XILINX, INC., San Jose, CA (US)

(*) Notice: Subject to any disclaimer, the term of this patent is extended or adjusted under 35 U.S.C. 154(b) by 152 days.

(21) Appl. No.: 14/500,374

(22) Filed: Sep. 29, 2014

(51) Int. Cl.
*G06F 11/263* (2006.01)
*H03K 19/177* (2006.01)
*H03K 19/007* (2006.01)

(52) U.S. Cl.
CPC ......... *G06F 11/263* (2013.01); *H03K 19/007* (2013.01); *H03K 19/1776* (2013.01); *H03K 19/17764* (2013.01)

(58) Field of Classification Search
CPC .. G06F 11/1004; G06F 11/106; G06F 11/183; G06F 17/5054
See application file for complete search history.

(56) References Cited

U.S. PATENT DOCUMENTS

| | | | | |
|---|---|---|---|---|
| 5,887,003 A | * | 3/1999 | Ranson | G01R 31/318566 702/186 |
| 7,576,557 B1 | * | 8/2009 | Tseng | H03K 19/17752 326/14 |
| 7,864,620 B1 | * | 1/2011 | Pedersen | G11C 7/1006 365/154 |
| 2004/0153630 A1 | * | 8/2004 | Henry | G06F 9/30145 712/209 |
| 2005/0066096 A1 | * | 3/2005 | Ruemmler | G06F 9/30101 710/200 |

* cited by examiner

*Primary Examiner* — Jigar Patel
(74) *Attorney, Agent, or Firm* — LeRoy D. Maunu

(57) ABSTRACT

A programmable IC is disclosed that includes a programmable logic sub-system, a processing sub-system, and a safety sub-system. The programmable logic sub-system is configured to operate a hardware portion of the user design. The processing sub-system configured to execute a software portion of the user design. The safety sub-system is configured to perform a set of operations to detect errors in the programmable IC. The first set of operations writes to at least one of a set of registers using a write macro function. In response to writing to the register with the write macro function, a list of registers stored in the memory is updated to include the register. Registers included in the list of registers are tested to determine whether or not an upset has occurred.

18 Claims, 4 Drawing Sheets

US 9,734,032 B1

DIAGNOSTIC COVERAGE OF REGISTERS BY SOFTWARE

FIELD OF THE INVENTION

The disclosure generally relates to diagnostic coverage of safety systems in a programmable integrated circuit (IC).

BACKGROUND

Programmable integrated circuits (ICs) are devices that can be programmed to perform specified logic functions. One type of programmable IC, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a set of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some programmable ICs include an embedded processor that is capable of executing program code. The processor can be fabricated as part of the same die that includes the programmable logic circuitry and the programmable interconnect circuitry, also referred to collectively as the "programmable circuitry" of the IC. It should be appreciated that execution of program code within a processor is distinguishable from "programming" or "configuring" the programmable circuitry that may be available on an IC. The act of programming or configuring the programmable circuitry of an IC results in the implementation of different physical circuitry as specified by the configuration data within the programmable circuitry.

In some applications, circuit components are exposed to environments where radiation is present. Sub-atomic particles of such radiation can cause an error when the particles pass through the source/drain-to-well junction of transistors. Neutron and alpha particles are of particular concern due to their ability to inject charge into the junction. The primary source of neutrons is solar radiation, while alpha particles may come from radioactive decay of packaging materials. The charge induced by particle strikes can upset the switching state of the transistor struck by the particle, resulting in an error. As the charge dissipates, nearby transistors may also be affected. The charge induced by particle strikes can upset the static state of bi-stable data storage circuits (e.g., latches, flip-flops, registers, and memory cells) causing the circuit to remember the incorrect data value. This type of error is referred to as a single event upset (SEU).

SUMMARY

A programmable IC is disclosed that includes a programmable logic sub-system, a processing sub-system, and a safety sub-system. The programmable logic sub-system includes a plurality of programmable logic circuits configured in response to a first subset of configuration data. The processing sub-system includes one or more processing circuits configured to execute a software program in response to a second subset of configuration data. The safety sub-system including a set of registers, a memory, and a circuit that performs a safety function configured to detect errors in the programmable IC. The safety function writes to at least one register of the set of registers using a write macro function in the process of the detecting errors. The write macro function dynamically updates a list of registers stored in the memory to include registers as the registers are written to by the write macro function for a first time. The circuit in the safety sub-system is also configured to test registers included in the list of registers, using a test function, to determine whether or not an upset has occurred.

A method is also disclosed for operating a programmable IC. A hardware portion of the user design is operated in a programmable logic sub-system of a programmable IC. A software portion of the user design is executed on a processing sub-system of the programmable IC. A first set of operations is performed by a safety sub-system of the programmable IC to detect errors in the programmable IC. The first set of operations writes to at least one of a set of registers using a write macro function. In response to writing to the register with the write macro function, the register is included in a list of registers stored in the memory. Registers included in the list of registers are tested to determine whether or not an upset has occurred.

Other features will be recognized from consideration of the Detailed Description and Claims, which follow.

BRIEF DESCRIPTION OF THE DRAWINGS

Various aspects and features of the disclosed methods and circuits will become apparent upon review of the following detailed description and upon reference to the drawings in which.

DETAILED DESCRIPTION OF THE DRAWINGS

Figure 1:
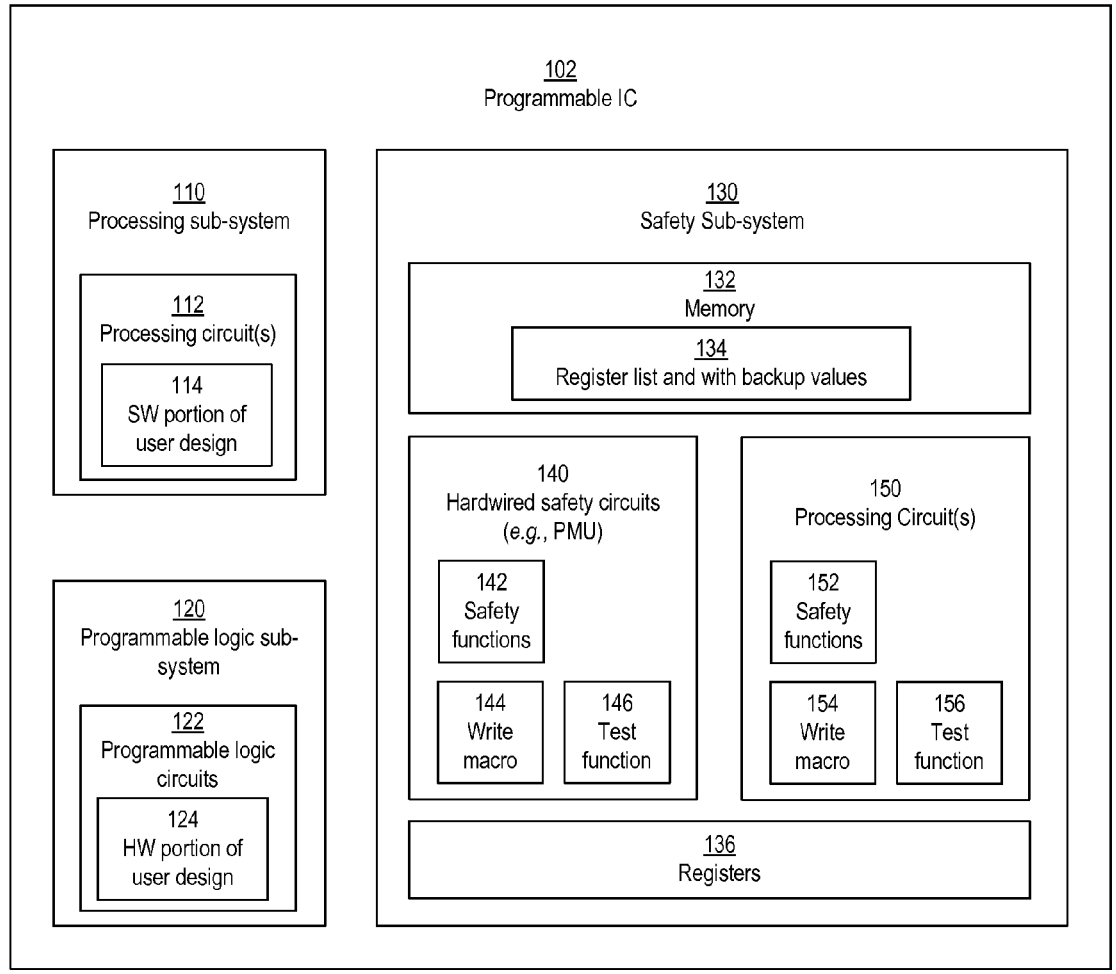
FIG. 1 shows a first programmable IC, consistent with one or more implementations.

In some applications, a programmable IC may include a safety sub-system configured to perform one or more safety functions that detect and/or mitigate errors that occur in the programmable IC. Such a safety sub-system may be required to monitor mission critical circuits or functions in order to satisfy high-safety certification standards, such as IEC 61508 SIL3 or ISO-26262 ASILC. In some implementations, the safety sub-system includes a set of registers, which are used by the safety sub-system to store data values used in the process of detecting and/or mitigating errors. Occurrence of an SEU in the set of registers may cause the safety sub-system to operate incorrectly.

Circuits and methods are disclosed for detecting and correcting SEUs that occur in a set of registers included in a safety sub-system. The safety sub-system is configured to store a backup of data values for the registers used by the safety sub-system in a memory protected against SEU. The memory may be protected against SEU, for example, by an error correction code (ECC) circuit. A test function may detect an SEU in a protected register by comparing the data value stored in the register to the backup data value stored in the memory. If the values do not match, an SEU is presumed to have occurred in the register. The backup data value stored in the protected memory can be used to restore the value stored in the register to the correct value.

In some implementations, the safety sub-system is configured to write to the registers using a write macro function. The write macro function identifies registers used by the safety sub-system, as the registers are written to by the safety sub-system for the first time, and stores backup data values for the registers in the memory. The test function may be configured to only test registers that have backup data values stored in the memory. By dynamically storing backup data values as registers are written to, the test function only tests registers that are actually used by the safety sub-system. In instances where the safety sub-system does not use all of the set of registers, processing resources needed to perform the test function are reduced. For a subsequent write (after the initial write) to one of the registers, the write macro function updates the value stored in the register and also updates the backup data value for the register in the memory. The update of the register and the backup data value may introduce a race condition that causes the test function to incorrectly indicate that an SEU is detected. For instance, the test function may compare the value of the register and the backup data value, in the middle of the update process when only one of the register or backup data value has been updated.

In some implementations, a bit-wise mask or status indicator is also stored in the memory along with the backup data value and an address for the register. The bit-wise mask may be used to coordinate operation of the write macro and test functions to ensure that a register is not tested by the test function at the same that the register and backup data value are updated by the write macro function. For example, prior to updating and/or testing one of the registers, the bit-wise mask may be checked to verify that the register is not currently being updated or tested. For instance, in some implementations, each bit of the bit-wise mask may be set to a logical zero to indicate that the register is currently being updated or tested.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein.

Turning now to the figures, FIG. 1 shows a first programmable IC, configured in accordance with one or more implementations. The programmable IC 102 includes a processing sub-system 110, a programmable logic sub-system 120, and a safety sub-system 130. The programmable logic sub-system 120 includes a plurality of programmable logic circuits 122 that may be configured by a first portion of a set of configuration data to form a hardware portion of a user design 124. The processing sub-system 110 includes one or more processing circuits 112 that may be configured to execute program code of a software portion of a user design 114 included in a second portion of a set of configuration data.

The safety sub-system 130 is configured to perform one or more safety functions 142 and 152, each being configured to detect and/or mitigate errors in the programmable IC 102. The safety sub-system 130 includes a set of hard-wired circuits 140 configured to perform hardware-based safety functions 142 for the programmable IC. The safety sub-system 130 also includes one or more processing circuits 150 configured to execute a set of software-based safety functions 152 for a second set of circuits of the programmable IC. The safety functions 142 and 152 may perform various actions to detect errors. The safety functions 142 and 152 may also perform various actions to mitigate detected errors. Actions to mitigate errors may include, for example voltage adjustment, power-down, sub-system reset, error signal generation, data backup, switch to redundant/backup system, and/or built-in-self test. In some implementations, the safety functions may be user defined functions provided in a third portion of the configuration data.

The safety sub-system 130 also includes a set of registers 136, which are written to by one or more of the safety functions 142 and 152 during operation. The safety functions 142 and 152 are configured to write to the registers 136 using a write macro function 144 and 154. The write macro functions 144 and 154 dynamically create a list of registers and backup data values in a memory 132, as the registers are written to by the write macro function for the first time. The write macro function may be performed by software code 154 executed by the processing circuit 150 or by a functionally equivalent circuit 144 included in the hardwired circuits 140. The memory 132 may be protected against SEU, for example, by an error correction code. When the write macro functions 144 and 154 perform a subsequent write to one of the registers 136, the write macro functions 144 and 154 update the backup data value 134 for the register in the memory.

One or both of the hardwired circuits 140 and processing circuits 150 are configured to implement respective test functions 146 and 156. The test functions 146 and 156 are configured to test each of the registers 136 included in the list to determine whether or not SEU has occurred in the register. The test functions 146 and 156 may test a register for SEU by comparing a value stored in the register to a backup data value 134 stored in the memory 132. By testing only registers of the set of registers 136 that are also included in the list of registers 134, computational resources needed to perform the test functions is reduced.

Subsequent writes to a register by one of the write macro functions 144 and 154 may create a race condition that causes the test functions 146 or 156 to incorrectly indicate that an SEU is detected. As an example scenario, the write macro functions 144 and 154 may first change the value stored in a register. Prior to the write macro functions 144 and 154 updating the backup data value 134 in the memory 132, one of the test functions 146 or 156 may read and compare the new value in the register 126 and the old backup data value from the memory 132. If the old and new values are different, the test function will interpret the difference as an SEU.

In some implementations, each entry in the list of registers 134 includes an address or other identifier of the register, a backup data value, and a bit-wise mask or status indicator that may be used to coordinate operations between the write macro functions 144 and 154 and the test functions 146 and 156. As described in more detail with reference to FIGS. 2 and 3, prior to updating one of the registers, the write macro functions 144 and 154 set the bit-wise mask for the register to a value (e.g., all zeroes) to indicate that the register is currently being updated. After update of the register and backup value has completed, the bit-wise mask for the register is set to a second value to indicate that the register is not currently being updated.

Figure 2:
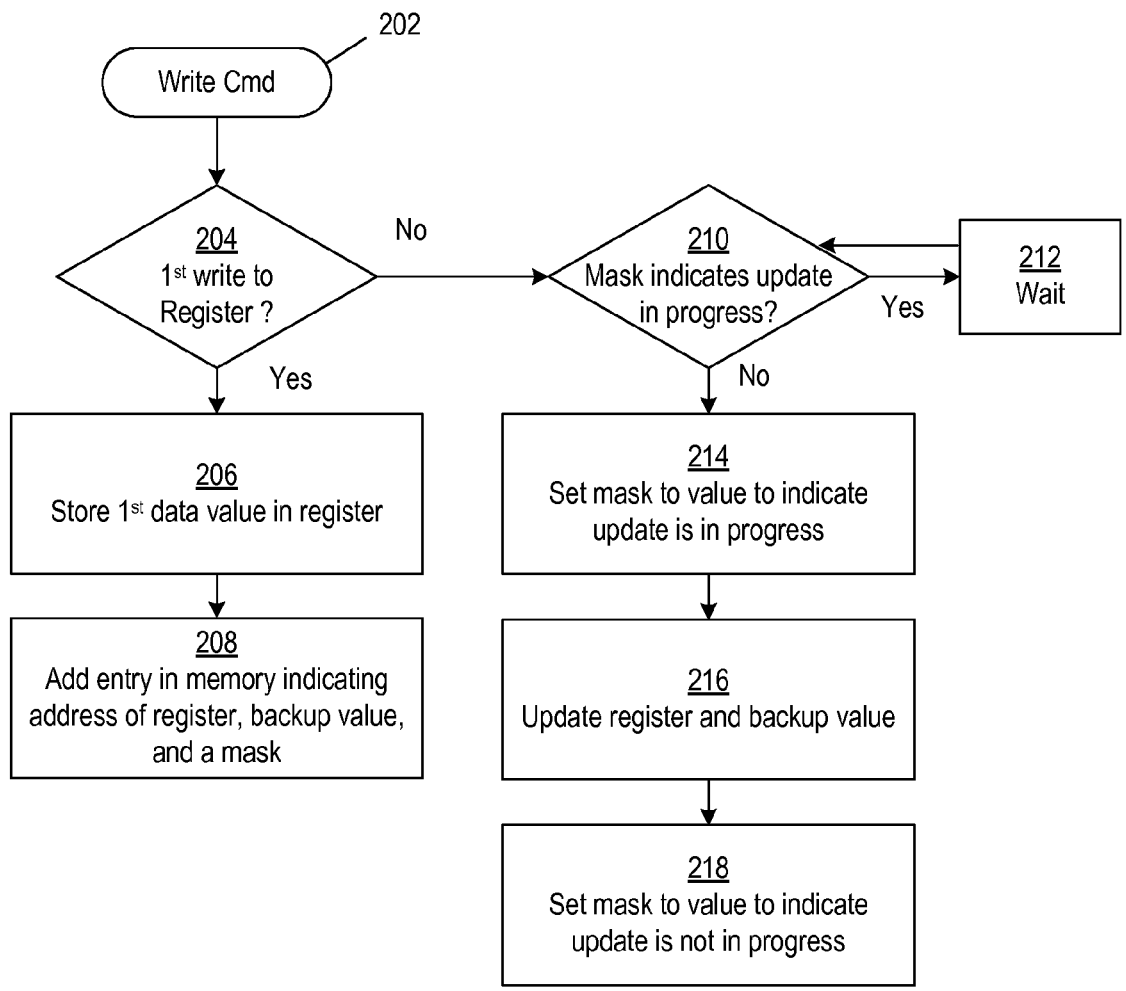
FIG. 2 shows an example process performed by the write macro function(s), in accordance with one or more implementations.

FIG. 2 shows an example process performed by the write macro function(s), in accordance with one or more implementations. The process is initiated by a write command 202 from a safety function or other user application to write to a register. If the register is being written to for the first time, decision block 204 directs the process to block 206, where a first data value to be written is stored in the register. At block 208 an entry for the register is added to a list stored in a memory. The entry includes, for example, an address field indicating an address of the register, a backup data value equal to the first data value, and a bit-wise mask. The bit-wise mask may be set to a value indicating update of the register is not in progress.

If a write to the register is not the first write to the register, the process continues to decision block 210. While the bit-wise mask stored in the memory for the register indicates that an update of the register is in progress, decision block 210 directs the process to wait at block 212. For example, in some implementations, a bit-wise mask having all bits set to zero may be used to indicate that an update of the register is in progress. If the bit-wise mask indicates that no update of the register is in progress, the process proceeds to block 214, where the bit-wise mask is set to the value to indicate that an update of the register is in progress. This prevents the test function(s) from accessing the register and backup data value during the update. In some implementations, it is possible that a test of the register may be in progress when the bit-wise mask is set at block 214. In some implementations, the process may wait a short period of time after setting the bit-wise mask at block 214 to allow any pending tests to complete. At block 216, the register and the backup data value in the memory are updated to be equal to the new data value indicated in the write command 202. At block 218, the bit-wise mask for the register in the memory is set to a value that indicates update of the register is not in progress.

Figure 3:
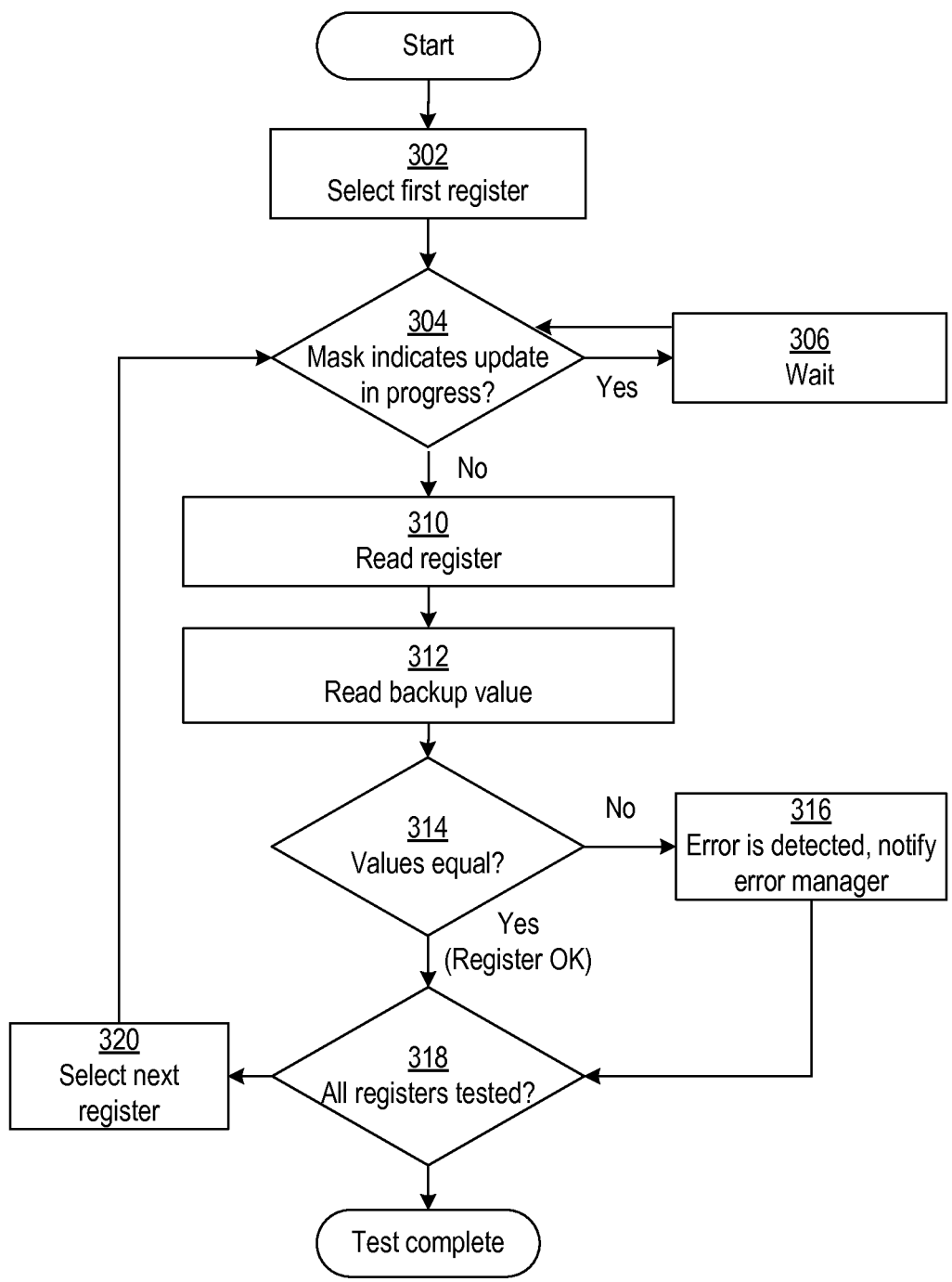
FIG. 3 shows an example process performed by the test function(s), in accordance with one or more implementations.

FIG. 3 shows an example process performed by the test function(s), in accordance with one or more implementations. When the test process is initiated, the process selects a first one of the registers at block 302. Decision block 304 directs the process to wait at block 306 while the bit-wise mask indicates that an update of the register is in progress. If the bit-wise mask does not indicate that an update of the register is in progress, the process proceeds to block 310. At block 310, a first data value is read from the register to be tested. At block 312, a backup data value corresponding to the register is read from the memory. If the first data value and the backup data value are not equal, at decision block 314, an error is detected and an error manager is notified of the error at block 316 (for example by generating an error signal). If the first data value and the backup data value are equal at decision block 314, the value stored in the register is OK. If all of the registers have been tested at decision block 318, testing is complete. Otherwise, the next register is selected at block 320 and the test performed at blocks 304 through 318 is repeated for the selected register.

The methods and circuits may be used to efficiently mitigate upsets for various sets of registers in a system. Various implementations may be particularly useful for mitigating testing of static and pseudo static registers in a system, which are written to once or infrequently in a system. An occurrence of an upset in these registers may persist for long period of time before a new value is written and is more likely to introduce errors into a system. As these register are written to infrequently, little processing overhead is required to update backup values for the registers. Conversely, for registers that are written to frequently, upset is less likely to introduce errors into the system and a larger amount of processing resources are required to update backup values for these registers. If a register is written to frequently enough (e.g., greater than 100 ms), it may be unnecessary to test the register for upsets. In some implementations, a system may determine a frequency that backup values are updated for registers included in the list of register. The system may remove a register from the list of register if the frequency of updates exceeds a predetermined threshold to prevent the system from updating a backup value and testing the register for upset.

Figure 4:
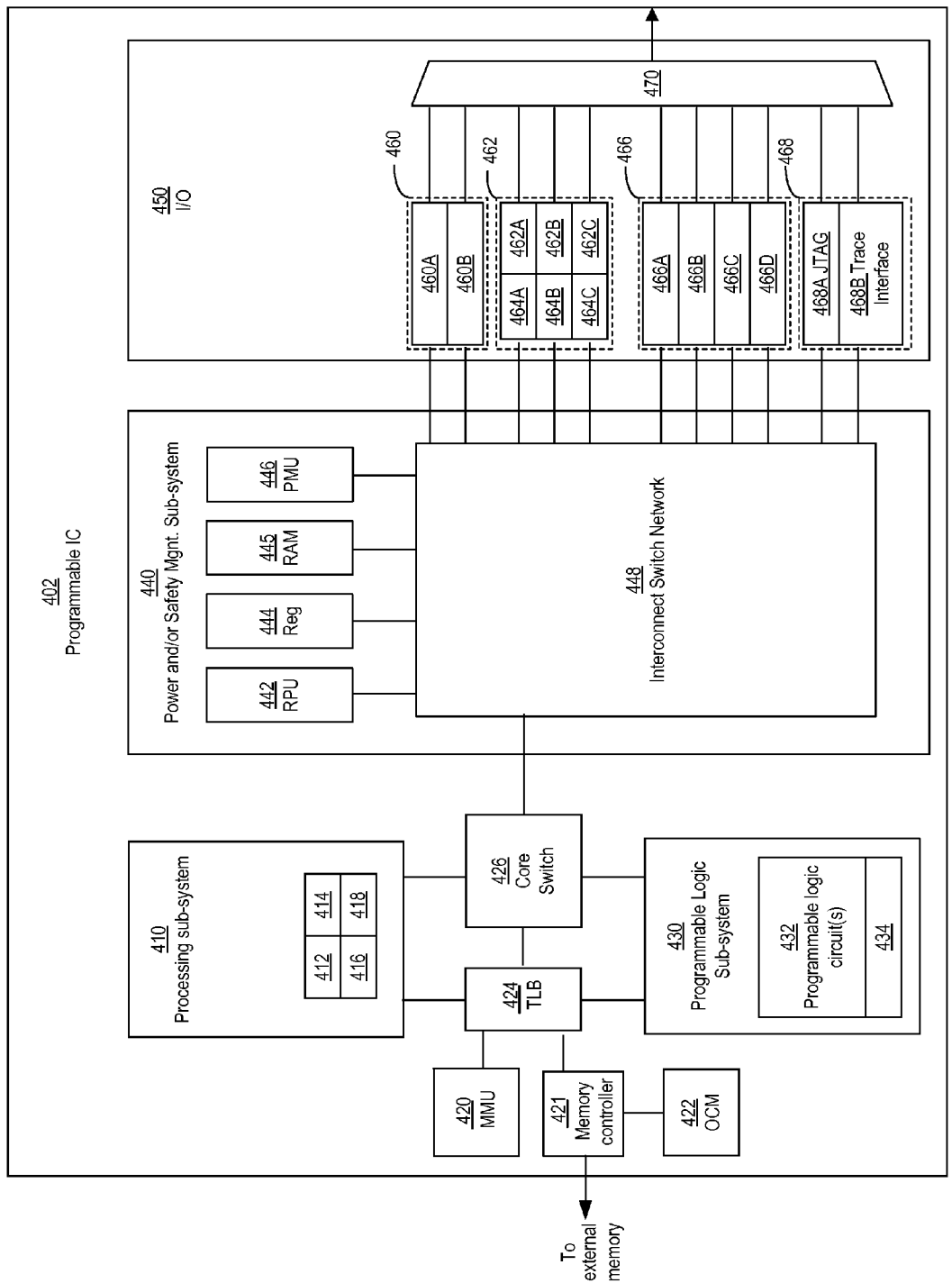
FIG. 4 shows a second programmable IC, consistent with one or more implementations.

FIG. 4 shows a second programmable IC, consistent with one or more implementations. The programmable IC 402 may also be referred to as a System-on-chip (SOC), which includes a processing sub-system 410 and a programmable logic sub-system 430. The processing sub-system 410 may be programmed to implement a software portion of the user design, via execution of a user program. The program may be specified as part of a set of configuration data or may be retrieved from an on-chip or off-chip data storage device. The processing sub-system 410 may include various circuits 412, 414, 416, and 418 for executing one or more software programs. The circuits 412, 414, 416, and 418 may include, for example, one or more processor cores, floating point units (FPUs), an interrupt processing unit, on chip-memory, memory caches, and/or a cache coherent interconnect.

The programmable logic sub-system 430 of the programmable IC 402 may be programmed to implement a hardware portion of a user design. For instance, the programmable logic sub-system may include a number of programmable logic circuits 432, which may be programmed to implement a set of circuits specified in a set of configuration data. The programmable logic circuits 432 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable logic circuits 432 may be programmed by loading a set of configuration data into the configuration memory cells, which define how the programmable interconnect circuits and programmable logic circuits are configured. The collective states of the individual memory cells then determine the function of the programmable logic circuits 432. The configuration data can be read from memory (e.g., from an external PROM) or written into the programmable IC 402 by an external device. In some implementations, configuration data may be loaded into configuration memory cells by a configuration controller 434 included in the programmable logic sub-system 430. In some other implementations, the configuration data may be loaded into the configuration memory cells by a start-up process executed by the processing sub-system 410.

The programmable IC 402 may include various circuits to interconnect the processing sub-system 410 with circuitry implemented within the programmable logic sub-system 430. Connections between circuits and sub-systems are illustrated as lines in FIG. 4. The various connections may be single or multi-bit signal lines and may be uni-directional or bi-directional. In this example, the programmable IC 402 includes a core switch 426 that can route data signals between various data ports of the processing sub-system 410 and the programmable logic sub-system 430. The core switch 426 may also route data signals between either of the programmable logic or processing sub-systems 410 and 430 and various other circuits of the programmable IC, such as an internal data bus. Alternatively or additionally, the processing sub-system 410 may include an interface to directly connect with the programmable logic sub-system—bypassing the core switch 426. Such an interface may be implemented, for example, using the AMBA AXI Protocol Specification (AXI) as published by ARM.

In some implementations, the processing sub-system 410 and the programmable logic sub-system 430 may also read or write to memory locations of an on-chip memory 422 or off-chip memory (not shown) via memory controller 421. The memory controller 421 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 421 is able to communicate is provided for purposes of illustration only and is not intended as a limitation or to be exhaustive. As shown in FIG. 4, the programmable IC 402 may include a memory management unit 420 and translation look-aside buffer 424 to translate virtual memory addresses used by the sub-systems 410 and 430 to physical memory addresses used by the memory controller 421 to access specific memory locations.

The programmable IC may include an input/output (I/O) sub-system 450 for communication of data with external circuits. The I/O sub-system 450 may include various types of I/O devices or interfaces including for example, flash memory type I/O devices, higher performance I/O devices, lower performance interfaces, debugging I/O devices, and/or RAM I/O devices.

The I/O sub-system 450 may include one or more flash memory interfaces 460 illustrated as 460A and 460B. For example, one or more of flash memory interfaces 460 can be implemented as a Quad-Serial Peripheral Interface (QSPI) configured for 4-bit communication. One or more of flash memory interfaces 460 can be implemented as a parallel 8-bit NOR/SRAM type of interface. One or more of flash memory interfaces 460 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 450 can include one or more interfaces 462 providing a higher level of performance than flash memory interfaces 460. Each of interfaces 462A-462C can be coupled to a DMA controller 464A-464C respectively. For example, one or more of interfaces 462 can be implemented as a Universal Serial Bus (USB) type of interface. One or more of interfaces 462 can be implemented as a gigabit Ethernet type of interface. One or more of interfaces 462 can be implemented as a Secure Digital (SD) type of interface.

The I/O sub-system 450 may also include one or more interfaces 466 such as interfaces 466A-466D that provide a lower level of performance than interfaces 462. For example, one or more of interfaces 466 can be implemented as a General Purpose I/O (GPIO) type of interface. One or more of interfaces 466 can be implemented as a Universal Asynchronous Receiver/Transmitter (UART) type of interface. One or more of interfaces 466 can be implemented in the form of a Serial Peripheral Interface (SPI) bus type of interface. One or more of interfaces 466 can be implemented in the form of a Controller-Area-Network (CAN) type of interface and/or an $I^2C$ type of interface.

The I/O sub-system 450 can include one or more debug interfaces 468 such as processor JTAG (PJTAG) interface 468A and a trace interface 468B. PJTAG interface 468A can provide an external debug interface for the programmable IC 402. Trace interface 468B can provide a port to receive debug, e.g., trace, information from the processing sub-system 410 or the programmable logic sub-system 430.

As shown, each of interfaces 460, 462, 466, and 468 can be coupled to a multiplexer 470. Multiplexer 470 provides a plurality of outputs that can be directly routed or coupled to external pins of the programmable IC 402, e.g., balls of the package within which the programmable IC 402 is disposed. For example, I/O pins of programmable IC 402 can be shared among interfaces 460, 462, 466, and 468. A user can configure multiplexer 470, via a set of configuration data to select which of interfaces 460-468 are to be used and, therefore, coupled to I/O pins of programmable IC 402 via multiplexer 470. The I/O sub-system 450, may also include a fabric multiplexer I/O (FMIO) interface (not shown) to connect interfaces 462-468 to programmable logic circuits of the programmable logic sub-system. Additionally or alternatively, the programmable logic sub-system 430 can be configured to implement one or more I/O circuits within programmable logic. In some implementations, the programmable IC 402 may also include a sub-system 440 having various circuits for power and/or safety management. For example, the sub-system 440 may include a power management unit 446 configured to monitor and maintain one or more voltage domains used to power the various sub-systems of the programmable IC 402. In some implementations, the power management unit 446 may disable power of individual sub-systems, when idle, to reduce power consumption, without disabling power to sub-systems in use.

The sub-system 440 may also include safety circuits to monitor the status of the sub-systems to ensure correct operation. For instance, the sub-system 440 may include one or more hard-wired circuits, such as power management unit 446 configured to perform hardware-based safety functions for various sub-systems or circuits of the programmable IC. The sub-system 440 may also include one or more real-time processors 442 configured to execute various software-based safety functions for various sub-systems or circuits of the programmable IC. The safety functions performed by the hardwired circuits (e.g., PMU 446) and/or real-time processors 442 may use one or more of a set of registers 444. As described with reference to FIG. 1, the safety functions are configured to perform data writes to the registers 444 using a write macro that dynamically creates a list of registers and backup data values in a memory 445. Data stored in the memory may be protected against SEU using, for example, an error correction code.

The safety functions may monitor the status of the various sub-systems and perform various actions to facilitate detection, prevention, and/or mitigation of errors in one or more sub-systems or circuits. In some implementations, the safety functions may take action in response to the status registers having values indicative of an error. For example, a safety function may generate an alert in response to detecting an error. As another example, a safety function may reset an individual sub-system to attempt to restore the sub-system to correct operation, as discussed with reference to FIGS. 1 and 2.

The safety functions to be performed may be specified in a safety policy stored in the memory 444. The safety policy performed by the safety sub-system may be hardcoded in a non-volatile type of memory or may be stored in the memory 444 at startup. In some implementations, the safety policy may be user configurable and provided, for example, in a subset of a set of configuration data.

The sub-system 440 includes an interconnect switch network 448 that may be used to interconnect various sub-systems. For example, the interconnect switch network 448 may be configured to connect the various sub-systems 410, 430, and 440 to various interfaces of the I/O sub-system 450. In some applications, the interconnect switch network 448 may also be controlled by one or more safety functions of the power management unit 446 or real-time processors 442 to isolate the real-time processors 442 from the sub-systems that are to be monitored. Such isolation may be required by certain application standards (e.g., IEC-61508 SIL3 or ISO-26262 standards) to ensure that the real-time processors 442 are not affected by errors that occur in other sub-systems. In some applications, interconnect switch network 448 may also be protected (e.g., by ECC or parity) to provide protection against random faults. In some applications, the interconnect switch network 448 may be protected by software-based tests that are periodically performed to test the interconnect switch network 448.

The methods and circuits are thought to be applicable to a variety of systems and applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. A programmable integrated circuit (IC), comprising:
   a programmable logic sub-system including a plurality of programmable logic circuits configured in response to a first subset of configuration data;
   a processing sub-system including one or more processing circuits configured to execute a software program in response to a second subset of configuration data; and
   a safety sub-system including:
      a set of registers;
      a memory; and
      a first circuit configured to:
         perform a safety function configured to detect errors in the programmable IC, wherein:
            the safety function writes a data value to at least one register of the set of registers using a write macro function in the process of detecting errors, and
            the write macro function is configured to store for each data value written to the at least one register, a copy of the data value in a list of registers stored in the memory, and as a register of the set of registers is written to by the write macro function for a first time, store a new entry in the list of registers to identify the register; and
         test registers identified by the list of registers, using a test function, to determine whether or not an upset has occurred in the registers, wherein the test function is configured for each register identified by the list of registers, to:
            read a first test value from the register;
            read a second test value from an entry in the list of registers that corresponds to the register; and
            compare the first test value to the second test value.

2. The programmable IC of claim 1, wherein the new entry in the list of registers includes an address field, a data field and a bit-wise mask, the address field being equal to an address of the register, and the data field being equal to the data value.

3. The programmable IC of claim 2, wherein for a write of a another data value to one of the registers having an address indicated in an entry of the list of registers, the write macro function is configured to:
   set the bit-wise mask from a first mask value to a second mask value;
   store the other data value in the register;
   store the other data value in the address field of the entry; and
   set the bit-wise mask to the first mask value.

4. The programmable IC of claim 3, wherein for a write of the other data value, the write macro function is further configured to, prior to setting the bit-wise mask to the second mask value, wait until the bit-wise mask is set to the first mask value.

5. The programmable IC of claim 1, further comprising:
   generating an error signal in response to the first test value being different than the second test value.

6. The programmable IC of claim 1, wherein the memory is protected against upset by an error correction code.

7. The programmable IC of claim 1, wherein:
   the safety sub-system further includes a second circuit configured to perform a second safety function that detects errors in the programmable IC, and write to at least one of the registers using the write macro function; and
   the second circuit is further configured to test, using the test function, registers included in the list of registers to determine whether or not upset has occurred.

8. The programmable IC of claim 1, wherein:
   the first circuit includes a processor; and
   the safety function and the write macro are software based functions executed on the processor.

9. The programmable IC of claim 1, wherein:
   the first circuit includes a hard-wired circuit configured to perform the safety function and the write macro; and
   the safety sub-system further includes a second circuit configured to mitigate errors detected by the first safety function.

10. A method, comprising:
   operating a hardware portion of a user design in a programmable logic sub-system of a programmable integrated circuit (IC);
   executing a software portion of the user design on a processing sub-system of the programmable IC;

performing a first set of operations to detect errors in the programmable IC using a safety sub-system of the programmable IC, wherein the first set of operations includes:
  writing a data value to a register of a set of registers using a write macro function;
  in response to writing the data value to the register with the write macro function, updating an entry to include the data value in a list of registers stored in a memory;
  wherein the writing to the register of the set of registers using the write macro function includes, for a first write to the register further includes storing a new entry in the list of registers, the new entry including an identifier of the register and a data field for storing the data value; and
  testing registers included in the list of registers to determine whether or not an upset has occurred, wherein testing includes for each register included in the list of registers:
    reading a first test value from the register;
    reading a second test value from an entry in the list of registers that corresponds to the register; and
    comparing the first test value to the second test value.

11. The method of claim 10, wherein the new entry further includes a bit-wise mask.

12. The method of claim 11, wherein the writing to the register of the set of registers using the write macro function includes, for a write of another data value to the register having an address indicated in the entry of the list of registers:
  setting the bit-wise mask in the entry from a first mask value to a second mask value;
  storing the other data value in the register;
  storing the other data value in the address field of the entry; and
  setting the bit-wise mask to the first mask value.

13. The method of claim 12, the write of the other data value to the register further includes:
  prior to setting the bit-wise mask to the second mask value, waiting until the bit-wise mask is set to the first mask value.

14. The method of claim 10, further including in response to the first test value being different than the second test value, generating an error signal.

15. The method of claim 10, further comprising protecting the list of registers stored in the memory using an error correction code.

16. The method of claim 10, wherein:
  the first set of operations to detect errors are performed by a first circuit of the safety sub-system; and
  further including performing a second set of operations to detect errors using a second circuit of the safety sub-system, the second set of operations including writing to at least one of the registers using the write macro function.

17. The method of claim 16, further comprising:
  using the second circuit, testing registers included in the list of registers to determine whether or not an upset has occurred.

18. The method of claim 10, further comprising:
  in response to detecting the error using the first set of operations, performing a second set of operations to mitigate the detected errors.

* * * * *